(12) United States Patent  (10) Patent No.: US 11,407,202 B2
Hashimoto et al.  (45) Date of Patent: Aug. 9, 2022

(54) ROLL-BONDED LAMINATE, METHOD FOR PRODUCING THE SAME, AND HEAT RADIATION REINFORCEMENT MEMBER FOR ELECTRONIC EQUIPMENT

(71) Applicant: TOYO KOHAN CO., LTD, Tokyo (JP)

(72) Inventors: Yusuke Hashimoto, Yamaguchi (JP); Teppei Kurokawa, Yamaguchi (JP)

(73) Assignee: Toyo Kohan Co., Ltd., Tokyo (JP)

( * ) Notice: Subject to any disclaimer, the term of this patent is extended or adjusted under 35 U.S.C. 154(b) by 0 days.

(21) Appl. No.: 17/266,476

(22) PCT Filed: Aug. 5, 2019

(86) PCT No.: PCT/JP2019/030723
§ 371 (c)(1),
(2) Date: Feb. 5, 2021

(87) PCT Pub. No.: WO2020/031956
PCT Pub. Date: Feb. 13, 2020

(65) Prior Publication Data
US 2021/0300000 A1 Sep. 30, 2021

(30) Foreign Application Priority Data

Aug. 6, 2018 (JP) .............................. JP2018-147973
Dec. 3, 2018 (JP) .............................. JP2018-226838

(51) Int. Cl.
*B32B 15/20* (2006.01)
*B32B 15/01* (2006.01)
*B23K 20/04* (2006.01)
*B23K 20/24* (2006.01)
*B32B 3/30* (2006.01)
(Continued)

(52) U.S. Cl.
CPC ............ *B32B 15/015* (2013.01); *B23K 20/04* (2013.01); *B23K 20/24* (2013.01); *B32B 3/30* (2013.01); *B32B 15/20* (2013.01); *C23F 4/00* (2013.01); *B23K 2103/05* (2018.08);
(Continued)

(58) Field of Classification Search
None
See application file for complete search history.

(56) References Cited

U.S. PATENT DOCUMENTS 5,328,772 A * 7/1994 Tanaka .................. F16C 33/124
428/548
9,421,741 B2 8/2016 Oda et al.
(Continued)

FOREIGN PATENT DOCUMENTS

JP 5410646 B1 2/2014
JP 6237950 B1 11/2017
(Continued)

*Primary Examiner* — Seth Dumbris
(74) *Attorney, Agent, or Firm* — Foley & Lardner LLP (57) ABSTRACT

This invention provides a roll-bonded laminate composed of a hard copper layer and a stainless steel layer, which is sufficient both in radiation performance and strength. A roll-bonded laminate 1A is composed of a copper layer 10A and a stainless steel layer 20A, in which thickness of the roll-bonded laminate 1A is 0.02 mm to 0.4 mm, hardness of the copper layer 10A is 70 Hv or higher, and 180° peel strength of the roll-bonded laminate 1A is 6 N/20 mm or more.

10 Claims, 4 Drawing Sheets

(51) Int. Cl.
*C23F 4/00* (2006.01)
*B23K 103/04* (2006.01)
*B23K 103/12* (2006.01)

(52) U.S. Cl.
CPC ..... *B23K 2103/12* (2018.08); *B32B 2307/212* (2013.01); *B32B 2457/00* (2013.01); *Y10T 428/12924* (2015.01)

(56) References Cited

U.S. PATENT DOCUMENTS

| | | | |
|---|---|---|---|
| 10,798,824 B2 | 10/2020 | Terasaki et al. | |
| 2013/0040821 A1* | 2/2013 | Okayama | C22C 38/007 |
| | | | 505/239 |
| 2019/0047254 A1 | 2/2019 | Yamamoto | |
| 2020/0031096 A1* | 1/2020 | Sadaki | B23K 20/227 |

FOREIGN PATENT DOCUMENTS

| | | | |
|---|---|---|---|
| JP | 2018-006743 A | 1/2018 | |
| WO | WO-2018147297 A1 * | 8/2018 | ........... B23K 20/227 |

* cited by examiner

ROLL-BONDED LAMINATE, METHOD FOR PRODUCING THE SAME, AND HEAT RADIATION REINFORCEMENT MEMBER FOR ELECTRONIC EQUIPMENT

CROSS-REFERENCE TO RELATED APPLICATIONS

This application is the U.S. National Stage of PCT/JP2019/030723, filed Aug. 5, 2019, which claims priority to JP 2018-147973, filed Aug. 6, 2018 and JP 2018-226838, filed Dec. 3, 2018.

TECHNICAL FIELD

The present invention relates to a roll-bonded laminate, a method for producing the same, and a heat radiation reinforcement member for electronic equipment.

BACKGROUND ART

Metallic materials are used in a wide variety of fields. For example, metallic materials are used as heat radiation reinforcement members (chassis materials that surround heat-radiating electronic components) for electronic equipment such as mobile electronic equipment. As such metallic materials, stainless steel has been extensively used. As other metallic materials, roll-bonded laminates (e.g., metal laminated materials or clad materials) comprising two or more types of metal plates or metal foils laminated on top of each other are known. A roll-bonded laminate is a sophisticated metallic material with multiple properties that cannot be achieved by a single material. For example, a roll-bonded laminate composed of stainless steel and copper superposed on top of the other aimed at improved thermal conductivity has been studied.

As conventional roll-bonded laminates, for example, the roll-bonded laminates disclosed in Patent Documents 1 and 2 are known. Patent Document 1 discloses a chassis made of a clad material in which a first layer made of austenite stainless steel, a second layer made of Cu or a Cu alloy stacked on the first layer, and a third layer made of austenite stainless steel stacked on a side of the second layer opposite from the first layer are roll-bonded to each other, wherein a thickness of the second layer is at least 15% of a thickness of the clad material, and a method for producing the same.

Patent Document 2 discloses a clad material comprising a first layer made of stainless steel and a second layer made of Cu or a Cu alloy roll-bonded to the first layer, wherein the grain size of the second layer measured by the method of comparison as defined in JIS H 0501 is 0.150 mm or less.

PRIOR ART DOCUMENTS

Patent Documents

[Patent Document 1] JP Patent No. 5,410,646
[Patent Document 2] JP Patent No. 6,237,950

SUMMARY OF THE INVENTION

Objects to be Attained by the Invention

Conventional roll-bonded laminates were disadvantageous in terms of low adhesion strength at the time of roll bonding. In order to improve peel strength, accordingly, it was necessary to perform heat treatment at 500° C. or higher after bonding. Specifically, Patent Document 1 describes that a clad material is subjected to diffusion annealing under a reducing atmosphere at approximately 1,000° C. after roll bonding. In the examples of Patent Document 2, in addition, roll bonding is followed by diffusion annealing at 950° C.

Copper is recrystallized and softened at 200° C. or higher. Because of the heat treatment as described above, copper is softened. Thus, it was impossible to produce a roll-bonded laminate made of hard copper and stainless steel. In recent years, however, the amount of heat generated inside electronic equipment is increased due to an increased communication speed or sophisticated performance. Thus, a heat radiation reinforcement member used for such electronic equipment is required to have enhanced radiation performance. When a roll-bonded laminate made of copper and stainless steel is used as a heat radiation reinforcement member and the proportion of copper relative to stainless steel is increased to achieve enhanced radiation performance, disadvantageously, strength of the entire roll-bonded laminate would be deteriorated because of softened copper.

Under the above circumstances, the present invention provides a roll-bonded laminate made of a hard copper layer and a stainless steel layer having sufficient radiation performance and strength.

Means for Attaining the Objects

The present inventors have conducted concentrated studies in order to attain the above object. As a result, they discovered that a roll-bonded laminate comprising a hard copper layer and having sufficient adhesion strength could be produced by employing copper tempering, etching conditions before bonding, load conditions at the time of bonding, and other conditions, in specific combinations. Specifically, the present invention is summarized as follows.
(1) A roll-bonded laminate composed of a copper layer and a stainless steel layer, wherein thickness of the roll-bonded laminate is 0.02 mm to 0.4 mm, hardness of the copper layer is 70 Hv or higher, and 180° peel strength of the roll-bonded laminate is 6 N/20 mm or more.
(2) The roll-bonded laminate according to (1), wherein thickness of the copper layer is 0.01 mm to 0.38 mm, and thickness of the stainless steel layer is 0.01 mm to 0.38 mm.
(3) The roll-bonded laminate according to (1) or (2), wherein hardness of the stainless steel layer is 180 Hv or higher.
(4) The roll-bonded laminate according to any one of (1) to (3), wherein 180° peel strength of the roll-bonded laminate is 8 N/20 mm or more.
(5) The roll-bonded laminate according to any one of (1) to (4), which has a bi-layer structure composed of the copper layer and the stainless steel layer.
(6) The roll-bonded laminate according to any one of (1) to (5), wherein the stainless steel layer is partially removed.
(7) The roll-bonded laminate according to any one of (1) to (5), wherein the stainless steel layer is partially removed and the copper layer is exposed at a site where the stainless steel layer is removed.
(8) The roll-bonded laminate according to any one of (1) to (5), wherein the copper layer is partially removed.
(9) The roll-bonded laminate according to any one of (1) to (5), wherein the copper layer is partially removed and the stainless steel layer is exposed at a site where the copper layer is removed.
(10) A heat radiation reinforcement member for electronic equipment comprising the roll-bonded laminate according to any one of (1) to (9).

(11) A method for producing a roll-bonded laminate composed of a copper layer and a stainless steel layer comprising:
a step of preparing a copper plate and a stainless steel plate;
a step of subjecting a surface of the copper plate and a surface of the stainless steel plate to be bonded to each other to sputter etching; and
a step of bringing the copper plate into contact with the stainless steel plate to roll-bond the copper plate to the stainless steel plate, wherein hardness of the copper layer is 80 Hv or higher, the copper plate is softened as a result of sputter etching and/or softened immediately before roll bonding by heat input from the stainless steel plate when the copper plate is brought into contact with the stainless steel plate, thickness of the roll-bonded laminate is 0.02 mm to 0.4 mm after bonding, hardness of the copper layer of the roll-bonded laminate is 70 Hv or higher, and 180° peel strength of the roll-bonded laminate is 6 N/20 mm or more.
(12) The method for producing a roll-bonded laminate according to (11), wherein the copper plate is softened to have hardness of less than 70 Hv as a result of sputter etching and/or softened to have hardness of less than 70 Hv immediately before roll bonding by heat input from the stainless steel plate when the copper plate is brought into contact with the stainless steel plate.

This description includes part or all of the content as disclosed in Japanese Patent Application Nos. 2018-147973 and 2018-226838, which are priority documents of the present application.

Advantageous Effects of the Invention

The roll-bonded laminate of the present invention comprises a hard copper layer, and it has high strength and excellent radiation performance. Such roll-bonded laminate can be preferably used as a heat radiation reinforcement member of electronic equipment.

EMBODIMENTS FOR CARRYING OUT THE INVENTION

Hereafter, the present invention is described in detail with reference to embodiments.

Figure 1:
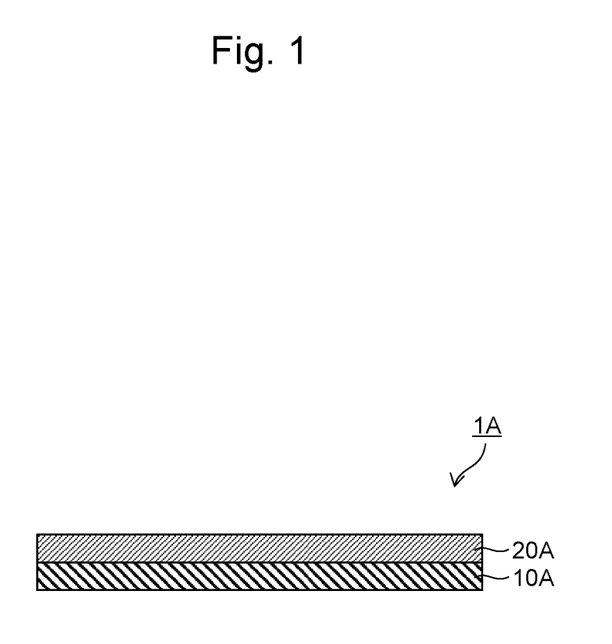
FIG. 1 is a cross-sectional diagram showing an embodiment of the roll-bonded laminate of the present invention.

FIG. 1 is a cross-sectional diagram showing an embodiment of the roll-bonded laminate of the present invention. As shown in FIG. 1, the roll-bonded laminate 1A according to the present embodiment has a bi-layer structure composed of a copper layer 10A and a stainless steel layer 20A.

For applications that require higher radiation performance for a roll-bonded laminate, the copper layer 10A can be a copper plate in which a total content of additional metal elements other than copper is 1% by mass or lower, and preferably 0.8% by mass or lower. Specific examples thereof include plate materials such as C1100 and C1020. For applications that require higher strength for a roll-bonded laminate, the copper layer 10A can be a copper plate in which a total content of additional metal elements other than copper exceeds 1% by mass. A specific example is a copper alloy plate such as Corson copper alloy.

The stainless steel layer 20A is not particularly limited, and a plate material, such as SUS304, SUS305, SUS201, SUS316, SUS316L, or SUS430, can be used. When a roll-bonded laminate is used for electronic equipment, in particular, use of an austenite stainless steel plate, such as SUS304, SUS305, SUS316, or SUS316L, is preferable.

Thickness of the roll-bonded laminate 1A is 0.02 mm to 0.4 mm, and preferably 0.03 mm to 0.37 mm. Thickness cannot be less than 0.02 mm because the roll-bonded laminate may be wrinkled or bent at the time of production. Thickness exceeding 0.4 mm is not preferable because of an increased weight or a reduced mounting space inside electronic equipment. When thickness exceeds 0.4 mm, a rolling reduction force at the time of roll bonding of the roll-bonded laminate may not be sufficient, and sufficient peel strength may not be achieved.

When a roll-bonded laminate is used for applications that require higher strength and radiation performance, such as a heat radiation reinforcement member, or a cover or a housing of an electronic member, etc., or a heat radiation member (e.g., the roll-bonded laminate 1C shown in FIG. 4 and the roll-bonded laminate 1B shown in FIG. 3), the lower limit of thickness is preferably 0.09 mm. When a reduced space is required, such as a functional member including a radiation/electromagnetic wave shield of an electronic member (e.g., the roll-bonded laminate 1A in the vapor chambers 2A and 2B shown in FIGS. 2 and 3), the upper limit of thickness is preferably 0.1 mm, more preferably 0.09 mm, and further preferably 0.055 mm. While the roll-bonded laminate 1A according to the present embodiment is very thin, strength of the copper layer 10A is higher than that of conventional techniques. Thus, a reduced space can be realized.

The term "thickness of the roll-bonded laminate 1A" used herein refers to the total thickness of the copper layer 10A and the stainless steel layer 20A. Thickness of the roll-bonded laminate 1A is determined by measuring thickness at arbitrary 30 points on the roll-bonded laminate 1A using a micrometer, and calculating the average thereof.

Thickness of the copper layer 10A and that of the stainless steel layer 20A of the roll-bonded laminate 1A are not particularly limited and adequately determined in accordance with, for example, applications of the roll-bonded laminate 1A. It is preferable that thickness of the copper layer 10A be 0.01 mm to 0.38 mm and thickness of the stainless steel layer 20A be 0.01 mm to 0.38 mm. It is more preferable that thickness of the copper layer 10A be 0.015 mm to 0.37 mm and thickness of the stainless steel layer 20A be 0.015 mm to 0.35 mm. It is further preferable that thickness of the copper layer 10A be 0.05 mm to 0.3 mm and thickness of the stainless steel layer 20A be 0.05 mm to 0.3 mm. When thickness of the copper layer exceeds 0.38 mm, in particular, it may not be possible to achieve sufficient peel strength. When thickness of the stainless steel layer 20A is excessively larger than that of the copper layer 10A, radiation performance of the roll-bonded laminate 1A may become insufficient. When the stainless steel layer 20A is excessively thin, the roll-bonded laminate 1A cannot achieve strength. Thus, thickness is adequately determined in consideration of the balance of such properties. According to the present invention, strength of the copper layer 10A is higher than that of conventional techniques. This can maintain the strength of the entire laminate if thickness of the copper layer 10A is increased to improve radiation performance of the roll-bonded laminate 1A. When the laminate is used for conventional applications, such as a heat radiation reinforcement member for electronic equipment, accordingly, the ratio of thickness of the copper layer 10A can be increased, compared with that according to a conventional technique. Specifically, the ratio of thickness of the copper layer 10A to thickness of the roll-bonded laminate 1A can be 5% to 95%, preferably 13% to 87%, and more preferably 15% to 85%. Thickness of the copper layer 10A and that of the stainless steel layer 20A of the roll-bonded laminate 1A are determined by obtaining an optical microscopic photograph of a cross section of the roll-bonded laminate 1A, measuring thickness of the copper layer 10A and that of the stainless steel layer 20A at randomly selected 10 points in the optical microscopic photograph, and calculating the average thereof. When producing the roll-bonded laminate 1A, a copper plate material is roll-bonded to a stainless steel plate material at a given rolling reduction ratio. In general, accordingly, thickness of the copper layer 10A and that of the stainless steel layer 20A of the roll-bonded laminate 1A become smaller than those of the copper plate material and the stainless steel plate material before bonding. In a measurement range of micrometers, however, the rolling reduction ratio becomes 0%, and thickness may not change.

In the roll-bonded laminate 1A of the present embodiment, the copper layer 10A is hard, and hardness thereof is 70 Hv or higher, preferably 75 Hv or higher, and more preferably 80 Hv or higher. The upper limit of hardness is not particularly limited, and it may be, for example, 130 Hv. Because the copper layer 10A is hard, the roll-bonded laminate 1A that has excellent radiation performance and high strength can be produced. In addition, it is preferable that the stainless steel layer 20A be sufficiently hard. Specifically, hardness is preferably 180 Hv or higher, more preferably 200 Hv or higher, and further preferably 250 Hv or higher. Hardness Hv of a copper layer is measured using Micro Vickers Hardness Tester (load: 50 gf) in accordance with JIS Z 2244 (Vickers hardness test—Test method). Hardness Hv of a stainless steel layer is measured using Micro Vickers Hardness Tester (load: 100 gf) when a stainless steel layer thickness is 0.1 mm or larger and Micro Vickers Hardness Tester (load: 50 gf) when a stainless steel layer thickness is smaller than 0.1 mm in accordance with JIS Z 2244 (Vickers hardness test—Test method).

The roll-bonded laminate 1A of the present embodiment has peel strength (180° peel strength) of, as an indicator of adhesion strength between the copper layer 10A and the stainless steel layer 20A, 6 N/20 mm or more. In accordance with application, such as a heat radiation reinforcement member, peel strength is preferably 8 N/20 mm or more, and more preferably 10 N/20 mm or more, so as to suppress peeling at the interface of the roll-bonded laminate during the step of processing. In case of significantly increased peel strength, materials are broken without peeling from each other. Thus, there is no upper limit for peel strength.

Peel strength of the roll-bonded laminate 1A is measured in the manner described below. Test pieces with a width of 20 mm are prepared from the roll-bonded laminate 1A, the copper layer 10A is partially peeled from the stainless steel layer 20A, and a thicker layer or, when thickness of the copper layer is equal to that of the stainless steel layer, a harder layer is fixed. Thereafter, a thinner layer, or when thickness of the copper layer is equal to that of the stainless steel layer, a softer layer is pulled toward the direction opposite by 180° from the fixed part at a tensile speed of 50 mm/min, and a force required to peel the thinner layer or the softer layer from the fixed site (unit: N/20 mm) is measured using a universal testing machine, TENSILON RTC-1350A (manufactured by Orientec Corporation). When a test piece with a width other than 20 mm is used in a similar test, peel strength varies depending on the test piece width. The peel strength determined with the use of the test piece with a width of 10 mm may be converted into the peel strength determined with the use of the test piece with a width of 20 mm by multiplying a factor of the test piece width; i.e., 20 mm/10 mm, which is about 2 times.

The roll-bonded laminate 1A of the present embodiment preferably exhibits elongation of 3% to 50%, and more preferably 5% to 40%, measured by the tensile test conducted with the use of a test piece with a width of 12.5 mm. This can provide satisfactory press workability. With the use of, for example, the test piece for the tensile test described below, elongation can be measured in accordance with the method of measurement of elongation at break specified by JIS Z 2241.

Concerning the roll-bonded laminate 1, the maximal load applied in the tensile test conducted with the use of a test piece with a width of 12.5 mm is preferably 200 N or higher. From the viewpoint of sufficient strength, such maximal load is more preferably 250 N or higher, and further preferably 300 N or higher. The tensile strength can be calculated based on the maximal load applied, and the tensile strength is determined by dividing the maximal load applied in the tensile test by a cross sectional area of the test piece. The maximal tensile load and the tensile strength can be measured using, for example, the universal testing machine, TENSILON RTC-1350A (manufactured by Orientec Corporation) in accordance with JIS Z 2241 (the method for tensile test for metallic materials). The width of the test piece (12.5 mm) is equivalent to the specification of No. 13B defined by JIS Z 2241.

On the surfaces of the copper layer 10A and the stainless steel layer 20A opposite from the interface of the roll-bonded laminate 1A, according to need, a protective layer can be provided aimed at anti-corrosion, anti-oxidation, anti-discoloration, and the like, provided that functions, such as conductivity and radiation performance, are not disturbed. Examples of protective layers of the copper layer 10A include a chemical coat layer and a Ni-plated layer. In the present embodiment, thickness, hardness, and other properties of the roll-bonded laminate 1A and other layers are of a laminate consisting of the copper layer 10A and the stainless steel layer 20A without the protective layer.

The roll-bonded laminate 1A described above has excellent radiation performance achieved by the copper layer 10A and the entire laminate has high strength because of the hard copper layer 10A. Because of such properties, the roll-bonded laminate 1A can be used as a functional member, such as a heat radiation reinforcement member (a chassis) for various electronic equipment such as mobile electronic equipment and PC, an electronic member for transportation means such as an automobile, or a cover, a housing, or a radiation/electromagnetic wave shield of an electronic member for home appliance. When the roll-bonded laminate 1A is used as a component of electronic equipment, a magnetic stainless steel layer 20A may cause radio disturbance. Thus, a non-magnetic material such as an austenite material is preferably used for the stainless steel layer 20A.

Figure 2:
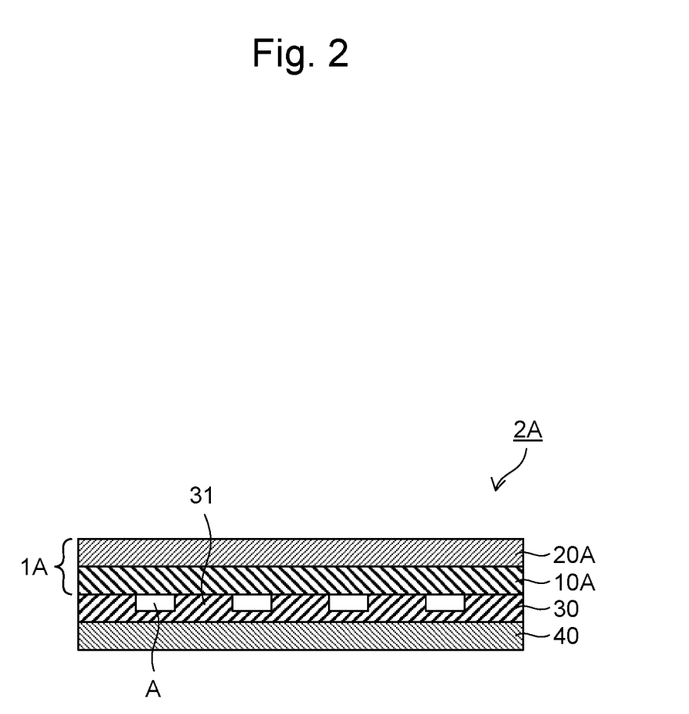
FIG. 2 is a cross-sectional diagram showing an embodiment of a vapor chamber, which is an application example of the roll-bonded laminate.

FIG. 2 is a cross-sectional view of a vapor chamber, which is an application example of the roll-bonded laminate 1A of the present embodiment. The vapor chamber 2A comprises the roll-bonded laminate 1A composed of the copper layer 10A and the stainless steel layer 20A, and the copper plate 30 having a columnar convex 31 and the stainless steel plate 40 are further superposed on the copper layer 10A side. A region A surrounded by the convex 31 comprises operating fluid such as pure water sealed therein. A heat from a heat source located on the stainless steel plate 40 side (not shown) causes operating fluid in the region A to evaporate, a heat released from the stainless steel layer 20A side concentrates the vapor, and the concentrated vapor is refluxed downward. With the repetition of such cycle, a heat can be efficiently diffused in horizontal and vertical directions.

Figure 3:
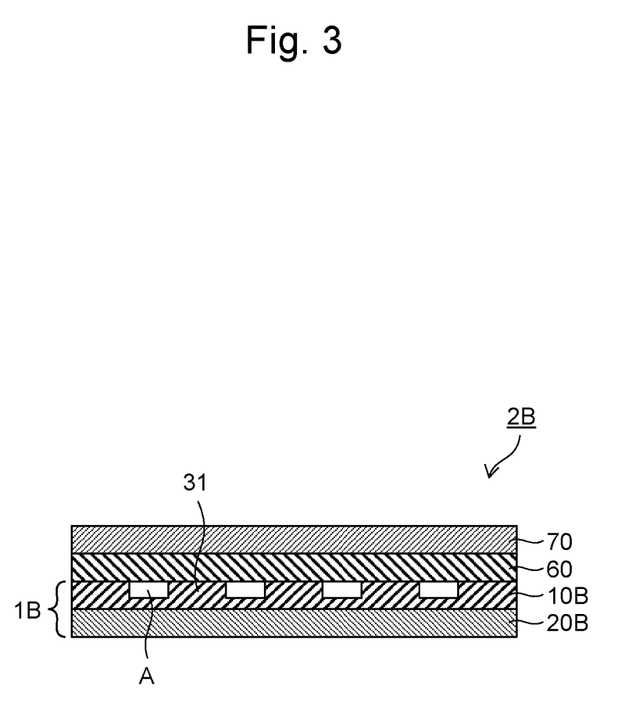
FIG. 3 is a cross-sectional diagram showing another embodiment of a vapor chamber, which is an application example of the roll-bonded laminate.

FIG. 3 is a cross-sectional diagram showing another embodiment of the vapor chamber. The vapor chamber 2B comprises the roll-bonded laminate 1B of the present invention composed of the copper layer 10B and the stainless steel layer 20B instead of the copper plate 30 and the stainless steel plate 40 of the vapor chamber 2A shown in FIG. 2. The copper layer 60 and the stainless steel plate 70 are superposed on the copper layer 10B side. The roll-bonded laminate 1B can be produced by processing the roll-bonded laminate 1A shown in FIG. 1. The copper layer 10B is partially removed via etching or other means, and a columnar convex 31 and a region A surrounded by the convex 31 are formed as with the case shown in FIG. 2. The region A comprises operating fluid sealed therein. The copper layer 60 and the stainless steel plate 70 may constitute the roll-bonded laminate 1A of the present invention as shown in FIG. 2, the copper layer may be a soft copper layer, or the copper layer may be a plated layer. From the viewpoint of enhanced strength of the entire vapor chamber 2B, the copper layer 60 and the stainless steel plate 70 preferably constitute the roll-bonded laminate of the present invention. It should be noted that the structures of the vapor chambers shown in FIGS. 2 and 3 are examples and that the structures are not limited thereto.

Figure 4:
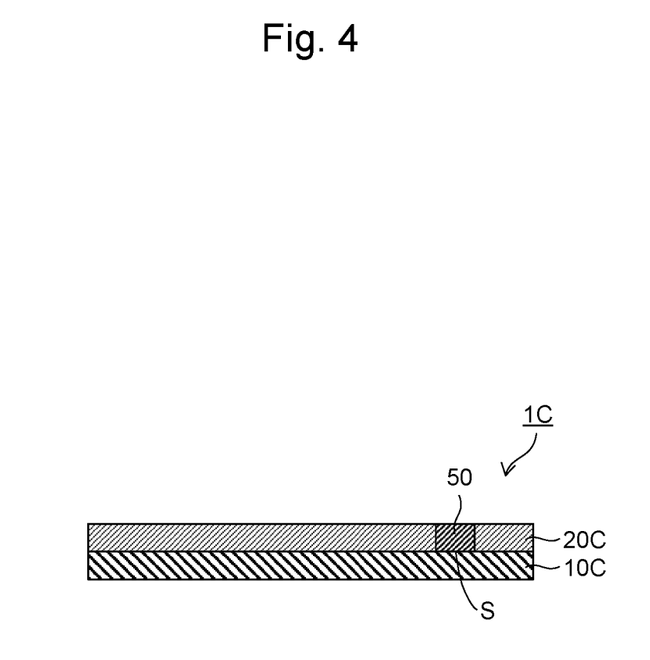
FIG. 4 is a cross-sectional diagram showing another embodiment of the roll-bonded laminate of the present invention.

FIG. 4 is a cross-sectional diagram showing another embodiment of the roll-bonded laminate of the present invention. The roll-bonded laminate 1C according to the present embodiment has a bi-layer structure composed of a copper layer 10C and a stainless steel layer 20C. In addition, the stainless steel layer 20C is partially removed and the copper layer 10C is exposed at a site S where the stainless steel layer 20C is removed. In the site S where the copper layer 10C is exposed, as shown in FIG. 3, a heat transport device 50, such as a heat pipe, can be embedded. The site S where the stainless steel layer 20C is removed may be used as a space for mounting another device. Thus, an integrated component with a smaller number of concave and convex portions as a whole can be obtained. Because of such a structure, the heat transport device 50 can be brought into direct contact with the copper layer 10C, a heat transported by the heat transport device 50 can be directly diffused onto the copper layer 10C, and higher radiation effects can be achieved over the entire laminate. Other constitutions of the roll-bonded laminate 1C shown in FIG. 4 are the same as those of the embodiment shown in FIG. 1. In the embodiment shown in FIG. 4, the site S where the heat transport device 50 is mounted is selectively removed from the stainless steel layer 20C, although the constitution is not limited thereto.

A stainless steel layer subjected to mesh processing or punching (i.e., multiple sites are partially removed from the stainless steel layer) may be laminated with a copper layer. According to the embodiment shown in FIG. 4, the stainless steel layer 20C is partially removed, and the copper layer 10C is exposed in the site S where the stainless steel layer 20C is removed. It is not necessary to remove the stainless steel layer 20C to the extent that the copper layer 10C is exposed. For example, an area near the surface of the stainless steel layer 20C may be selectively removed, and the depth of the removed area may not reach the interface between the stainless steel layer 20C and the copper layer 10C. When the heat transport device 50, such as a heat pipe, is embedded in such structure, the distance between the heat transport device 50 and the copper layer 10C may be reduced, so that radiation performance can be improved and strength of a part of the stainless steel layer 20C can be maintained.

Unlike the embodiment shown in FIG. 4, a roll-bonded laminate composed of a copper layer and a stainless steel layer may have a structure such that a copper layer is partially removed instead of a stainless steel layer. The roll-bonded laminate 1B in the vapor chamber 2B shown in FIG. 3 is an example of the laminate from which a copper layer is partially removed. At the site where the copper layer is removed, the stainless steel layer may or may not be exposed. For example, a copper layer subjected to mesh processing or punching (i.e., multiple sites are partially removed from the copper layer) may be laminated with a stainless steel layer.

In the embodiments shown in FIGS. 1 and 4, a roll-bonded laminate having a bi-layer structure composed of a copper layer and a stainless steel layer is described, although the structure is not limited thereto. A roll-bonded laminate may comprise 3 or more layers of copper layers and stainless steel layers. For example, stainless steel layers may be superposed on both surfaces of the copper layer to constitute a roll-bonded laminate having a tri-layer structure of a stainless steel layer/a copper layer/a stainless steel layer. Alternatively, a roll-bonded laminate may have a tri-layer structure of a copper layer/a stainless steel layer/a copper layer. When multiple copper layers and/or multiple stainless steel layers are employed, copper layer thickness or stainless steel layer thickness in the roll-bonded laminate is the total thickness of multiple copper layers and/or multiple stainless steel layers. The roll-bonded laminate is required to have 180° peel strength of 6 N/20 mm or more, and such strength is required at all the interfaces between copper layers and stainless steel layers.

Subsequently, the method for producing the roll-bonded laminate of the present invention is described. The roll-bonded laminate can be produced by preparing stainless steel plates and copper plates and subjecting such plates to various techniques, such as cold roll bonding, hot roll bonding, or surface-activated bonding, to bond them to each other. According to hot roll bonding, layers are roll-bonded to each other while applying heat. Since copper layers are easily softened by heat, conditions, such as heating temperature, heating duration, and bonding load, should be adequately selected in order to achieve hardness of 70 Hv or higher. In the case of cold roll bonding, in general, bonding should be followed by annealing to improve adhesion strength. Since copper layers are easily softened, bonding conditions should be adequately modified to allow copper layers to achieve hardness of 70 Hv or higher.

Accordingly, a roll-bonded laminate is preferably produced via surface-activated bonding. Specifically, a roll-bonded laminate is produced by a method comprising preparing a stainless steel plate and a copper plate, subjecting surfaces of the stainless steel plate and the copper plate to be bonded to each other to sputter etching, bringing the surfaces subjected to sputter etching into contact with each other, and then roll bonding the surfaces to each other at a given rolling reduction ratio.

From the viewpoint of mold workability, annealed materials (BA materials), ½H materials, and the like are preferably used for a stainless steel plate. From the viewpoint of retention of high strength, for example, ½H materials, ¾H materials, H materials, and tension-annealed materials are preferably used, although materials are not limited thereto.

Thickness of the stainless steel plate before bonding can be adequately determined in consideration of thickness of the stainless steel layer after bonding. Specifically, thickness is preferably 0.01 mm to 0.4 mm. Thickness of the stainless steel plate before bonding can be determined using a micrometer or the like, measuring thickness at randomly selected 10 points on the surface of the stainless steel plate, and calculating the average thereof.

As a copper plate to be bonded to a stainless steel plate, it is necessary to use an original plate that can be softened via sputter etching and/or an original plate that can be softened immediately before roll bonding by heat input from the stainless steel plate when the copper plate is brought into contact with the stainless steel plate. It is particularly preferable that a plate be softened to hardness of less than 70 Hv immediately before roll bonding. If a plate is softened via sputter etching, hardness resulting from softening is maintained. Thus, the plate can remain softened immediately before roll bonding. If the copper plate is not sufficiently softened immediately before roll bonding, it is not possible to achieve sufficient adhesion strength (peel strength) via the subsequent roll bonding. In order to soften the copper plate via sputter etching or by heat input from the stainless steel plate (the stainless steel plate is also heated via sputter etching) when the copper plate is brought into contact with the stainless steel plate, the prepared copper plate (the copper plate before softening) preferably has hardness of 80 Hv or higher, and more preferably hardness of 90 Hv or higher. Use of an H material is preferable. When hardness is higher than 70 Hv to lower than 80 Hv, softening may become difficult with the calorie generated by etching or heat input from the stainless steel plate. Thus, a ¼H material is not preferable. The reason therefor is deduced as described below. In order to soften; i.e., restore or recrystallize, the copper plate via sputter etching or heat input from the stainless steel plate when the copper plate is brought into contact with the stainless steel plate, it was found necessary that certain displacement or distortion be present in the copper plate. In the copper plate having hardness of higher than 70 Hv to lower than 80 Hv, displacement or distortion observed therein was insignificant. It is thus considered that such plate would not be sufficiently softened via sputter etching or heat input from the stainless steel plate when the copper plate is brought into contact with the stainless steel plate.

Alternatively, a copper plate can be an annealed material (0 material) having hardness of lower than 70 Hv.

Thickness of the copper plate before bonding can be adequately determined in consideration of thickness of the copper layer after bonding. Specifically, thickness is preferably 0.01 mm to 0.45 mm. When thickness of the copper plate exceeds 0.45 mm, sufficient adhesion strength may not be achieved after bonding. At the time of bonding, deformation of the entire copper layer elongation and deformation of an area near the bonding interface of the copper plate are caused with the application of a load. In order to achieve sufficient adhesion, deformation of an area near the bonding interface of the copper plate is critical. As thickness increases, deformation of the entire copper layer elongation becomes dominant, and deformation at the bonding interface necessary for adhesion is not likely to occur. Thus, it is considered difficult to achieve sufficient adhesion strength as the copper plate thickness increases. Thickness of the copper plate before bonding can be measured as with the case of the stainless steel plate.

For example, sputter etching is carried out by preparing the stainless steel plate and the copper plate in the form of long coils with a width of 100 mm to 600 mm, designating the stainless steel plate or the copper plate having a bonding surface as a ground-connected electrode, applying an alternating current of 1 MHz to 50 MHz to a region between the electrode and the other insulated electrode to generate a glow discharge, and adjusting an area of the electrode exposed to the plasma generated by the glow discharge to one third or less of the area of the other electrode. During sputter etching, the ground-connected electrode is in the form of a cooling roll, which prevents the transfer materials from temperature increase.

Sputter etching is intended to completely remove substances adsorbed to the surface and remove an oxide layer from the surface by subjecting the bonding surface of the stainless steel plate and the surface of the copper layer to sputtering with inert gas in vacuum. Examples of inert gas that can be applied include argon, neon, xenon, krypton, and a mixed gas comprising at least one of the inert gases mentioned above.

The stainless steel plate is preferably subjected to sputter etching to the least extent, so as to prevent the temperature of the stainless steel plate from excessively increasing. A heat that would soften the copper plate only when the copper plate is brought into contact with the stainless steel plate is sufficient. If temperature of the stainless steel plate remains high after bonding, the copper plate cannot be hardened because of heat input from the stainless steel plate. In the case of a single plate, for example, the plate can be subjected to sputter etching in vacuum at a plasma output of 100 W to 1 kW for 1 to 50 minutes. In the case of a long material such as a line material, for example, it can be subjected to sputter etching at a plasma output of 100 W to 10 kW and a line velocity of 1 m/min to 30 m/min. While a higher degree of vacuum is preferable in order to prevent substances from being readsorbed onto the surface, a degree of vacuum of $1 \times 10^{-5}$ Pa to 10 Pa is sufficient. During sputter etching, temperature of the stainless steel plate is preferably maintained between 5° C. and 300° C. The amount of etching on the stainless steel plate is preferably, for example, 40 nm to 250 nm, and more preferably 50 nm to 150 nm.

The copper plate is preferably subjected to sputter etching under conditions in which the oxide layer is completely removed from the surface. If the oxide layer is not removed by sufficient etching, adhesion strength to the stainless steel plate would become insufficient. In the case of a single plate, for example, the plate can be subjected to sputter etching in vacuum at a plasma output of 100 W to 1 kW for 1 to 50 minutes. In the case of a long material such as a line material, for example, it can be subjected to sputter etching at a plasma output of 100 W to 10 kW and a line velocity of 1 m/min to 30 m/min. While a higher degree of vacuum is preferable in order to prevent substances from being readsorbed onto the surface, a degree of vacuum of $1 \times 10^{-5}$ Pa to 10 Pa is sufficient. The amount of etching on the copper plate is preferably, for example, 5 nm to 200 nm, and more preferably 20 nm to 150 nm. When hardness of the copper plate is 80 Hv or higher, it is necessary to adjust hardness of the copper plate to lower than 70 Hv by adjusting the amount of etching on the copper plate to 20 nm or more, and preferably 40 nm or more or by heat input from the stainless steel plate when the copper plate is brought into contact with the stainless steel plate.

The bonding surface of the stainless steel plate and that of the copper plate subjected to sputter etching in the manner described above are brought into contact with each other, so as to allow the stainless steel plate to be bonded to the copper plate via, for example, roll bonding. Thus, the roll-bonded laminate of the present invention can be obtained.

At the time of roll bonding, a high rolling reduction force is applied, so as to improve adhesion strength to adjust 180° peel strength to 6 N/20 mm and harden the copper layer to adjust hardness to 70 Hv or higher. An insufficient rolling reduction force cannot be employed because sufficient adhesion strength cannot be achieved or the copper layer cannot be hardened. When the rolling reduction force is excessively high, in contrast, warping that is difficult to reduce via a step of shape modification may occur on the roll-bonded laminate.

A line pressure load for roll bonding is not particularly limited. It may be adequately determined to achieve given adhesion strength and hardness of the copper layer. For example, a line pressure load can be adjusted within a range of 1.0 tf/cm to 10.0 tf/cm. When a diameter of a pressure roll is 100 mm to 250 mm, for example, a line pressure load for roll bonding is preferably 1.5 tf/cm to 5.0 tf/cm, and more preferably 2.0 tf/cm to 4.0 tf/cm. When a roll diameter is increased or the stainless steel plate or the copper plate (the copper plate, in particular) is thick before bonding, a line pressure load may be increased, according to need, so as to maintain a pressure. It should be noted that a roll diameter is not limited to such range.

The rolling reduction ratio of the entire roll-bonded laminate is measured using a micrometer, and it is preferably 0% to 20%, and more preferably 0% to 15%. The rolling reduction ratio of the roll-bonded laminate is determined based on the total thickness of the stainless steel plate and of the copper plate, which are materials before bonding, and thickness of the final form of the roll-bonded laminate. Specifically, the rolling reduction ratio of the roll-bonded laminate is determined by the formula: (the total thickness of the stainless steel plate and the copper plate before bonding—the thickness of the final form of the roll-bonded laminate)/the total thickness of the stainless steel plate and the copper plate before bonding.

At the time of bonding, ambient temperature is not particularly limited, and it is, for example, room temperature to 150° C.

Bonding is preferably carried out in vacuum or in the non-oxidizing atmosphere, such as in an inert gas atmosphere (e.g., Ar), as with the case of etching, so as to prevent oxygen from being readsorbed onto the surface of the stainless steel plate and that of the copper plate and to prevent the bonding strength therebetween from lowering.

The roll-bonded laminate prepared by roll bonding the stainless steel plate to the copper plate in the manner described above maintains a hard copper layer. In the present invention, accordingly, heat treatment is not generally performed.

The roll-bonded laminate produced by roll bonding a stainless steel plate to a copper plate in the manner described above is preferable as a heat radiation reinforcement member for electronic equipment. A desirable thickness varies depending on a site where the laminate is used in the electronic equipment; i.e., the site of use. When thickness of the roll-bonded laminate is 0.12 mm to 0.4 mm, hardness of the copper layer is preferably 70 Hv or higher, more preferably 75 Hv or higher, further preferably 80 Hv or higher, and particularly preferably 85 Hv or higher, and peel strength is 6 N/20 mm or more, and more preferably 8 N/20 mm or more, from the viewpoint of workability. The maximal tensile load is preferably 300 N or more. Since higher hardness, higher peel strength, and a higher maximal tensile load are preferable, the upper limits thereof are not particularly limited.

When thickness of a roll-bonded laminate used for a heat radiation reinforcement member is 0.09 mm to less than 0.12 mm, a margin for elongation is small at the time of reduction, and hardness is less likely to increase. When an increase in hardness is intended, a very high rolling reduction force relative to thickness becomes necessary, and such rolling reduction force would cause difficulty in production (e.g., considerable warping would occur). Thus, hardness of the copper layer is preferably 70 Hv to 110 Hv, and more preferably 80 Hv to 100 Hv. Peel strength is 6 N/20 mm or more, and the maximal tensile load is preferably 200 N or more from the viewpoint of handling or strength. Since higher peel strength and a higher maximal tensile load are preferable, the upper limits thereof are not particularly limited. When such thin roll-bonded laminate is used for electronic equipment, an advantage such that a mounting space is further increased inside the electronic equipment is more emphasized.

When thickness of a roll-bonded laminate for a heat radiation reinforcement member is 0.02 mm to less than 0.09 mm, a margin for elongation is small at the time of reduction, and hardness is less likely to increase. When an increase in hardness is intended, a very high rolling reduction force relative to thickness becomes necessary, and such rolling reduction force would cause difficulty in production (e.g., considerable warping or wrinkling would occur). Thus, hardness of the copper layer is preferably 70 Hv to 110 Hv, and more preferably 75 Hv to 100 Hv. Peel strength is 6 N/20 mm or more, and the maximal tensile load is preferably 150 N or more from the viewpoint of handling or strength. Since higher peel strength and a higher maximal tensile load are preferable, the upper limits thereof are not particularly limited. When such thin roll-bonded laminate is used for electronic equipment, an advantage such that a mounting space is further increased inside the electronic equipment is more emphasized.

EXAMPLES

Hereafter, the present invention is described in greater detail with reference to examples and reference examples, although the present invention is not limited to these examples.

As Examples 1 to 9 and Comparative Examples 1 to 17, bi-layer roll-bonded laminates composed of copper layers and stainless steel layers were prepared. Thickness, tempers, and types (material types) of copper plates (Cu) and stainless steel plates (SUS) subjected to bonding are shown in Tables 1 and 2.

When subjecting a copper plate and a stainless steel plate to bonding, the copper plate and the stainless steel plate were subjected to sputter etching. The plasma output (W) and the processing duration (min) employed for sputter etching in the examples and the comparative examples are shown in Tables 1 and 2. The amount of etching (nm) on the copper plate and the stainless steel plate are also shown. The amount of etching on the copper plate was calculated based on the results of the preliminary experiment by designating the etch rate as 6.0 nm/min at the plasma output of 700 W. The amount of etching on the stainless steel plate was calculated with reference to the literature "Kiyoichi Takatsu, "Sputter," Television, Vol. 17, No. 7, pp. 44 to 50" by designating the etch rate as 3.0 nm/min at the plasma output of 700 W based on the iron etch rate on copper.

In Tables 1 and 2, the term "including suspension" in the column indicating RF treatment conditions in Examples 5 and 6 and Comparative Example 10 refers to the situation in which sputter etching is performed for 3 minutes, followed by suspension for 3 minutes, sputter etching is performed again for 3 minutes, followed by suspension for 3 minutes, and sputter etching is then performed for an additional 1 minute.

The copper plate and the stainless steel plate subjected to sputter etching were brought into contact with each other at room temperature and roll-bonded to each other using pressure rolls with diameters of 100 mm to 200 mm to produce a roll-bonded laminate. Tables 1 and 2 show the line pressure load (tf/cm) employed in the examples and the comparative examples.

In Comparative Examples 13 to 17, surface-activated bonding was followed by heat treatment at 700° C. for 10 minutes.

The roll-bonded laminates produced in Examples 1 to 9 and in Comparative Examples 1 to 17 were subjected to measurement of 180° peel strength (N/20 mm), Vickers hardness (Hv) of the copper layer and the stainless steel layer, the maximal tensile load (N), the tensile strength (N/mm$^2$), and elongation (%). The 180° peel strength was measured in accordance with the procedure described above using a universal testing machine, TENSILON RTC-1350A (manufactured by Orientec Corporation). In the examples other than Examples 8 and 9, hardness of the copper layer was measured using Micro Vickers Hardness Tester (load: 50 gf), and hardness of the stainless steel layer was measured using Micro Vickers Hardness Tester (load: 100 gf) in accordance with JIS Z 2244 (Vickers hardness test—Test method). In Examples 8 and 9, hardness of the copper layer was measured using Micro Vickers Hardness Tester (load: 50 gf), and hardness of the stainless steel layer was measured using Micro Vickers Hardness Tester (load: 50 gf) in accordance with JIS Z 2244 (Vickers hardness test—Test method). The maximal tensile load, the tensile strength, and the elongation were measured by processing the roll-bonded laminate in the form of a test piece of the specification of No. 13B using a universal testing machine, TENSILON RTC-1350A (manufactured by Orientec Corporation) in accordance with the method described above and JIS Z 2241 (the method for tensile test for metallic materials). Also, Vickers hardness of the copper plate in a region that is not brought into contact with rolls at the time of roll bonding (i.e., hardness of the copper plate immediately before roll bonding) was measured, and whether or not the copper plate was softened as a result of sputter etching and/or heat input from the stainless steel plate when the copper plate was brought into contact with the stainless steel plate was examined. The results of measurement are shown in Tables 1 and 2.

TABLE 1

| | Material | | | | RF treatment conditions | | | Results | | |
|---|---|---|---|---|---|---|---|---|---|---|
| | | | | | RF output | | | Total | Cu | SUS |
| | Type | Thickness (mm) | Temper | Hardness (Hv) | (W) × duration (min) | Rolling load (tf/cm) | Heat treatment (° C.) | thickness (mm) | etching amount (nm) | etching amount (nm) |
| Ex. 1 | C1100 | 0.2 | O | 65 | 700 × 7 | 2 | Not performed | 0.299 | 42 | 60 |
| | SUS304 | 0.1 | ½H | 312 | 700 × 20 | | | | | |
| Ex. 2 | C1100 | 0.2 | O | 65 | 700 × 7 | 3 | Not performed | 0.295 | 42 | 60 |
| | SUS304 | 0.1 | ½H | 312 | 700 × 20 | | | | | |
| Ex. 3 | C1020 | 0.1 | H | 120 | 700 × 7 | 2 | Not performed | 0.2 | 42 | 60 |
| | SUS304 | 0.1 | ½H | 312 | 700 × 20 | | | | | |
| Ex. 4 | C1020 | 0.1 | H | 120 | 700 × 20 | 2 | Not performed | 0.2 | 120 | 60 |
| | SUS304 | 0.1 | ½H | 312 | 700 × 20 | | | | | |
| Ex. 5 | C1020 | 0.1 | H | 120 | 700 × 7, including suspension | 3 | Not performed | 0.2 | 42 | 60 |
| | SUS304 | 0.1 | ½H | 312 | 700 × 20 | | | | | |
| Ex. 6 | C1020 | 0.1 | H | 120 | 700 × 7, including suspension | 3 | Not performed | 0.2 | 42 | 60 |
| | SUS304 | 0.1 | ½H | 312 | 700 × 20 | | | | | |
| Ex. 7 | C1020 | 0.3 | O | 46.8 | 700 × 20 | 3 | Not performed | 0.326 | 120 | 60 |
| | SUS304 | 0.1 | ½H | 312 | 700 × 20 | | | | | |
| Ex. 8 | C1020 | 0.095 | O | 48 | 700 × 7 | 3 | Not performed | 0.105 | 42 | 60 |
| | SUS304 | 0.015 | ½H | 250 | 700 × 20 | | | | | |
| Ex. 9 | C1020 | 0.016 | H | 116.7 | 700 × 20 | 2 | Not performed | 0.041 | 120 | 60 |
| | SUS304 | 0.025 | ½H | 315 | 700 × 20 | | | | | |
| Comp. Ex. 1 | C1100 | 0.2 | O | 65 | 700 × 3 | 0.4 | Not performed | 0.3 | 18 | 60 |
| | SUS304 | 0.1 | ½H | 312 | 700 × 20 | | | | | |
| Comp. Ex. 2 | C1100 | 0.2 | O | 65 | 700 × 7 | 1.5 | Not performed | 0.299 | 42 | 60 |
| | SUS304 | 0.1 | ½H | 312 | 700 × 20 | | | | | |
| Comp. Ex. 3 | C1100 | 0.2 | ¼H | 72 | 700 × 3 | 1.5 | Not performed | 0.298 | 18 | 60 |
| | SUS304 | 0.1 | ½H | 312 | 700 × 20 | | | | | |
| Comp. Ex. 4 | C1100 | 0.2 | ¼H | 72 | 700 × 7 | 1.5 | Not performed | 0.299 | 42 | 60 |
| | SUS304 | 0.1 | ½H | 312 | 700 × 20 | | | | | |

TABLE 1-continued

| | | Results | | | | | | |
|---|---|---|---|---|---|---|---|---|
| | | Softening of Cu immediately before roll bonding (Hardness Hv) | Peel strength (N/20 mm) | Cu Hardness (Hv) | SUS Hardness (Hv) | Max tensile load (N) | Tensile strength (N/mm$^2$) | Elongation (%) |
| Ex. 1 | | Not changed | 8.25 | 83 | 307 | 1582.2 | 425.3 | 16 |
| Ex. 2 | | Not changed | 10.4 | 97.1 | 320.8 | 1617.5 | 433.5 | 16 |
| Ex. 3 | | Softened: significant | 75.7 | 77.4 | 313.6 | 1321.1 | 528.4 | 16 |
| Ex. 4 | | Softened: significant (60.9) | 80.7 | 81.6 | 330.2 | 1318.2 | 524.7 | 14 |
| Ex. 5 | | Not changed (123.2) | 81.6 | 96 | 317.4 | 1323.4 | 529.3 | 11 |
| Ex. 6 | | Not changed | 88.4 | 95 | 309.4 | 1320 | 528 | 11 |
| Ex. 7 | | Not changed | 8.5 | 114 | 271.6 | 1362.7 | 324.6 | 27 |
| Ex. 8 | | Not changed | 45.5 | 82.2 | 251.7 | 546.7 | 347.1 | 17.1 |
| Ex. 9 | | Softened 50.4 | 22.5 | 77.5 | 336 | Not measured | Not measured | Not measured |
| Comp. Ex. 1 | | Not changed | 3.0 | 69.2 | 318 | 1542 | 405.7 | 14 |
| Comp. Ex. 2 | | Not changed | 2.5 | 85.9 | 314.4 | 1602 | 428.5 | 18 |
| Comp. Ex. 3 | | Not changed (72.6) | 1.66 | 85.9 | 314.4 | 1590.1 | 429.8 | 16 |
| Comp. Ex. 4 | | Not changed (75.0) | 1.0 | 89.6 | 311 | 1602.3 | 426.7 | 17 |

TABLE 2

| | Material | | | | RF treatment conditions | | | Results | | |
|---|---|---|---|---|---|---|---|---|---|---|
| | Type | Thickness (mm) | Temper | Hardness (Hv) | RF output (W) × duration (min) | Rolling load (tf/cm) | Heat treatment (° C.) | Total thickness (mm) | Cu etching amount (nm) | SUS etching amount (nm) |
| Comp. Ex. 5 | C1100 | 0.2 | ¼H | 72 | 700 × 20 | 1.5 | Not performed | 0.296 | 120 | 60 |
| | SUS304 | 0.1 | ½H | 312 | 700 × 20 | | | | | |
| Comp. Ex. 6 | C1100 | 0.2 | ¼H | 72 | 700 × 20 | 2 | Not performed | 0.296 | 120 | 60 |
| | SUS304 | 0.1 | ½H | 312 | 700 × 20 | | | | | |
| Comp. Ex. 7 | C1100 | 0.2 | ¼H | 72 | 700 × 7 | 3 | Not performed | 0.293 | 42 | 60 |
| | SUS304 | 0.1 | ½H | 312 | 700 × 20 | | | | | |
| Comp. Ex. 8 | C1100 | 0.2 | H | 123 | 700 × 7 | 3 | Not performed | 0.289 | 42 | 60 |
| | SUS304 | 0.1 | ½H | 312 | 700 × 20 | | | | | |
| Comp. Ex. 9 | C1020 | 0.1 | H | 120 | 700 × 3 | 2 | Not performed | 0.2 | 18 | 60 |
| | SUS304 | 0.1 | ½H | 312 | 700 × 20 | | | | | |
| Comp. Ex. 10 | C1100 | 0.05 | H | 126 | 700 × 7, including suspension | 1.5 | Not performed | 0.4 | 42 | 300 |
| | SUS304 | 0.35 | ½H | 310 | 700 × 100 | | | | | |
| Comp. Ex. 11 | C1100 | 0.2 | ¼H | 72 | 700 × 20 | 3 | Not performed | 0.296 | 120 | 60 |
| | SUS304 | 0.1 | ½H | 312 | 700 × 20 | | | | | |
| Comp. Ex. 12 | C1020 | 0.3 | O | 46.8 | 700 × 20 | 2 | Not performed | 0.333 | 120 | 60 |
| | SUS304 | 0.1 | ½H | 312 | 700 × 20 | | | | | |
| Comp. Ex. 13 | C1100 | 0.2 | ¼H | 72 | 700 × 20 | 1.5 | Performed at 700° C. × 10 min | 0.296 | 120 | 60 |
| | SUS304 | 0.1 | ½H | 312 | 700 × 20 | | | | | |
| Comp. Ex. 14 | C1020 | 0.1 | H | 120 | 700 × 7 | 2 | Performed at 700° C. × 10 min | 0.2 | 42 | 60 |
| | SUS304 | 0.1 | ½H | 312 | 700 × 20 | | | | | |

TABLE 2-continued

| | | | | | | | | | | |
|---|---|---|---|---|---|---|---|---|---|---|
| Comp. Ex. 15 | C1020 SUS304 | 0.1 0.1 | H ½H | 120 312 | 700 × 3 700 × 20 | 2 | Performed at 700° C. × 10 min | 0.2 | 18 | 60 |
| Comp. Ex. 16 | C1100 SUS304 | 0.2 0.1 | O ½H | 65 312 | 700 × 7 700 × 20 | 3 | Performed at 700° C. × 10 min | 0.296 | 42 | 60 |
| Comp. Ex. 17 | C1020 SUS304 | 0.3 0.1 | O ½H | 46.8 312 | 700 × 20 700 × 20 | 2 | Performed at 700° C. × 10 min | 0.333 | 120 | 60 |

| | Results | | | | | | |
|---|---|---|---|---|---|---|---|
| | Cu softening immediately before bonding (Hardness) | Peel strength (N/20 mm) | Cu Hardness (Hv) | SUS Hardness (Hv) | Max. tensile load (N) | Tensile strength (N/mm$^2$) | Elongation (%) |
| Comp. Ex. 5 | Not changed (76.7) | 3.8 | 94 | 315.4 | 1608.1 | 430.3 | 18 |
| Comp. Ex. 6 | Not changed (74.04) | 5.2 | 92.5 | 312.2 | 1633.1 | 442.9 | 21.5 |
| Comp. Ex. 7 | Not changed (75.9) | 4.0 | 96.7 | 316.8 | 1605.3 | 438.3 | 14.5 |
| Comp. Ex. 8 | Softened: little (81.3) | 2.5 | 95.7 | 321 | 1631.7 | 452.5 | 16 |
| Comp. Ex. 9 | Not measured | 4.8 | Not measured | 323.4 | Not measured | Not measured | Not measured |
| Comp. Ex. 10 | Not measured | 18.7 | 68.5 | 324.4 | 4049.2 | 800.9 | 40 |
| Comp. Ex. 11 | Not changed | 3.2 | 91.4 | 385 | 2045.8 | 552.9 | 17.6 |
| Comp. Ex. 12 | Not changed | 3.9 | 107.2 | 251 | 1342.5 | 322.5 | 22 |
| Comp. Ex. 13 | Not changed (76.7) | 199.8 or more | 41.7 | 318.2 | 1593.3 | 427.7 | 27 |
| Comp. Ex. 14 | Softened: significant | 159.7 or more | 37.7 | 318.8 | 1374.7 | 549.9 | 32 |
| Comp. Ex. 15 | Not measured | 222.6 or more | 37.8 | 320.8 | Not measured | Mot measured | Not measured |
| Comp. Ex. 16 | Not changed | 138.6 or more | 38.9 | 320.6 | 1576.9 | 426.2 | 26 |
| Comp. Ex. 17 | Not changed | 158.2 or more | 41.4 | 253.2 | 1216.7 | 295 | 34 |

As shown in Tables 1 and 2, all the roll-bonded laminates of Examples 1 to 9 had peel strength of 6 N/20 mm or more and hardness of the copper layer was 70 Hv or higher. Because of hardness of the copper layer, roll-bonded laminates with sufficient strength and radiation performance were obtained, and adhesion strength thereof was also sufficient.

In the roll-bonded laminates produced in Comparative Examples 13 to 17, hardness of the copper layer was low, and such laminates did not fulfill the requirements for the roll-bonded laminate of the present invention. Such results are considered to result from heat treatment performed at 700° C. after bonding, which had softened the copper layer.

The roll-bonded laminates produced in Comparative Examples 1 to 5 had low peel strength and thus were not sufficient for use in a heat radiation reinforcement member or other applications. Such results are deduced to result from insufficient adhesion strength caused by a small line lead (less than 2 tf/cm) relative to the copper layer thickness.

The roll-bonded laminates produced in Comparative Examples 3 to 7 had low peel strength for the following reasons. That is, the copper plate is made of a ¼H material, it is not softened by heat input from the stainless steel plate when the copper plate was brought into contact with the stainless steel plate, and adhesion strength is considered to be less likely to improve upon roll bonding.

In Comparative 8, an extent of softening of the copper plate caused by sputter etching is small. It is thus considered that the final form of the roll-bonded laminate may not have sufficient adhesion strength and peel strength may have been lowered.

In Comparative Example 9, a duration of sputter etching performed on the copper plate is short (3 minutes), and an oxide film may not be sufficiently removed from the copper plate surface. Thus, adhesion strength may not be improved via roll bonding and peel strength may have been lowered.

In the final form of the roll-bonded laminate produced in Comparative Example 10, hardness of the copper layer was low. Such low hardness is considered to result from a long duration of sputter etching performed on the stainless steel plate (100 minutes), which excessively raised temperature of the stainless steel plate and the copper layer had softened by heat input from the stainless steel layer after the copper layer had been roll-bonded to the stainless steel layer.

The roll-bonded laminate produced in Comparative Example 12 is considered to have failed to achieve sufficient peel strength because a line load of 2 tf/cm was insufficient for a thick copper plate (0.3 mm).

DESCRIPTION OF SYMBOLS 1A, 1B, 1C: Roll-bonded laminate
2A, 2B: Vapor chamber
10A, 10B, 10C: Copper layer
20A, 20B, 20C: Stainless steel layer
30: Copper plate
31: Convex
40, 70: Stainless steel plate
50: Heat transport device
60: Copper layer
A: Region
S: Site All publications, patents, and patent applications cited herein are incorporated herein by reference in their entirety.

The invention claimed is:

1. A roll-bonded laminate composed of a copper layer and a stainless steel layer, wherein thickness of the roll-bonded laminate is 0.02 mm to 0.4 mm, hardness of the copper layer is 70 Hv or higher, and 180° peel strength of the roll-bonded laminate is 6 N/20 mm or more.

2. The roll-bonded laminate according to claim 1, wherein thickness of the copper layer is 0.01 mm to 0.38 mm, and thickness of the stainless steel layer is 0.01 mm to 0.38 mm.

3. The roll-bonded laminate according to claim 1, wherein hardness of the stainless steel layer is 180 Hv or higher.

4. The roll-bonded laminate according to claim 1, wherein 180° peel strength of the roll-bonded laminate is 8 N/20 mm or more.

5. The roll-bonded laminate according to claim 1, which has a bi-layer structure composed of the copper layer and the stainless steel layer.

6. The roll-bonded laminate according to claim 1, wherein the stainless steel layer is partially removed.

7. The roll-bonded laminate according to claim 1, wherein the stainless steel layer is partially removed and the copper layer is exposed at a site where the stainless steel layer is removed.

8. The roll-bonded laminate according to claim 1, wherein the copper layer is partially removed.

9. The roll-bonded laminate according to claim 1, wherein the copper layer is partially removed and the stainless steel layer is exposed at a site where the copper layer is removed.

10. A heat radiation reinforcement member for electronic equipment comprising the roll-bonded laminate according to claim 1.

* * * * *